United States Patent

Hirata

[11] Patent Number: 6,126,530
[45] Date of Patent: Oct. 3, 2000

[54] CLEANING DEVICE FOR SURFACE PLATE CORRECTING DRESSER

[75] Inventor: Kazuhiko Hirata, Kanagawa, Japan

[73] Assignee: Speedfam Co., Ltd., Tokyo, Japan

[21] Appl. No.: 09/423,529

[22] PCT Filed: Mar. 10, 1999

[86] PCT No.: PCT/JP99/01145

§ 371 Date: Dec. 23, 1999

§ 102(e) Date: Dec. 23, 1999

[87] PCT Pub. No.: WO99/46083

PCT Pub. Date: Sep. 16, 1999

[30] Foreign Application Priority Data

Mar. 13, 1998 [JP] Japan ..................... 10-082888

[51] Int. Cl.[7] .......................... B24B 21/18; B24B 33/00; B24B 47/26; B24B 55/00
[52] U.S. Cl. .......................... 451/444; 451/442; 15/21.1; 15/88.2
[58] Field of Search .................. 15/21.1, 88.1, 15/88.2; 451/60, 56, 66, 103, 443, 444, 446

[56] References Cited

U.S. PATENT DOCUMENTS 5,749,772  5/1998  Shimokawa ..................... 451/56
5,807,167  9/1998  Walsh ............................. 451/56

*Primary Examiner*—Derris H. Banks
*Attorney, Agent, or Firm*—Michael K. Kelly; Snell & Wilmer, LLP

[57] ABSTRACT

To provide a cleaning apparatus capable of easily and positively washing off attachments from a dresser (6) for dressing a lap in a plane polishing apparatus. An air nozzle (15) for bubbling, a first bottom surface brush (18) that comes in slidable contact with a dressing member (9), and second bottom surface brushes (22a and 22b) that come in slidable contact with a portion (6a) other than the dressing member (9) are provided in a cleaning tank (11) for accommodating the dresser (6), which is provided with the dressing member (9) on its bottom surface, in a state where the dresser (6) is immersed in a cleaning solution. Furthermore, a side surface brush (25) that comes in contact with an outer side surface of the dresser (6) is provided.

10 Claims, 4 Drawing Sheets

CLEANING DEVICE FOR SURFACE PLATE CORRECTING DRESSER

TECHNICAL FIELD

The present invention relates to a cleaning apparatus for cleaning a dresser for dressing a lap in a plane polishing apparatus.

BACKGROUND ART

A plane polishing apparatus for polishing a surface of a disk-shaped workpiece such as a semiconductor wafer has, for example, a lap 2 rotatably installed to a base portion 1*a* of a machine body 1, and carriers 3 that are ascended and descended by air cylinders 5 and are installed to a movable portion 1*b* that can be shuttled between the lap 2 and a carrying in/out portion 4 as shown in FIG. 3 and FIG. 4. Workpieces W are retained to the bottom surfaces of the carriers 3 by such a method as adhesion or suction, and the workpieces W are pressed against a working surface of the turning lap 2 to polish them.

In the polishing apparatus mentioned above, generally, the lap 2 gradually wears and loses its flatness as it polishes workpieces, with resultant deterioration in polishing accuracy. Hence, the flatness is restored by periodically dressing the working surface of the lap 2 by a dresser 6.

As can be seen from FIG. 5, the dresser 6 has a dressing member 9 such as, for example, an annular grindstone, that is attached to the bottom surface of a round dressing head 8 provided at the distal end of a support arm 7. With the dressing member 9 pressed against the working surface of the lap 2, the lap 2 and the dressing head 8 are turned while supplying a polishing solution such as an abrasive slurry, thereby dressing the lap.

Diverse foreign matters are generated during the dressing process of the lap 2, and the foreign matters are apt to adhere to the dresser 6. Foreign matters includes, for instance, coagulated abrasive grains in the slurry, abrasive grains peeled off from the dressing member 9, and chips of ground polishing pads. These attachments come off during the dressing process of the lap 2, adversely affecting the dressing work or causing other problems such as deteriorated dressing accuracy. Hence, it is desirable to remove the foreign matters from the dresser.

DISCLOSURE OF INVENTION

A technological object of the present invention is to provide a cleaning apparatus capable of easily and positively washing off attachments adhering to a dresser.

To this end, according to the present invention, there is provided a cleaning apparatus having: a cleaning tank for accommodating a dresser immersed in a cleaning solution; a solution supply nozzle for filling the cleaning tank with a cleaning solution; an air nozzle provided in the cleaning tank to inject air into the cleaning solution; at least one first bottom surface brush disposed in the cleaning tank such that it comes in slidable contact with a dressing member of the bottom surface of the dresser; and at least one side surface brush provided laterally in the cleaning tank such that it comes in slidable contact with an outer side surface of the dresser.

In the cleaning apparatus having the configuration mentioned above, when the dresser provided with the dressing member on its bottom surface is placed in the cleaning tank and slowly turned while being immersed in the cleaning solution, the dressing member is brought into slidable contact with the first bottom surface brush to remove attachments, and an outer peripheral surface of the dresser is brought into slidable contact with an outer peripheral brush to remove attachments. At the same time, air is injected from the air nozzle to perform bubbling. The bubbling enhances the effect of removing the attachments by the impacts generated when bubbles burst; it not only further enhances the cleaning effect by being used in combination with the brush but also peels and washes off contaminants from the brush.

In the present invention, preferably, at least one second bottom surface brush is provided, in addition to the first bottom surface brush, in the cleaning tank such that it is brought into slidable contact with a portion other than the dressing member.

According to a specific embodiment in accordance with the present invention, in order to clean an annular dressing member on the bottom surface of the dresser, the first bottom surface brush is provided such that the brush is tilted at an angle so as to be in slidable contact with an inner peripheral surface of the dressing member. Furthermore, in order to clean a portion of the bottom surface of the dresser that is surrounded by the dressing member, the second bottom surface brush is installed such that it extends in the radial direction of the cleaning tank, and the aforesaid side surface brush is disposed in a position where it can be brought into slidable contact with the outer peripheral surface of the dressing member.

It is preferable to install a plurality of the second bottom surface brushes having different bristle heights. This arrangement makes it possible to use a short brush after a tall brush wears, permitting prolonged continuous use of brushes, which are apt to wear or deform.

According to another specific embodiment of the present invention, the air nozzle has a plurality of air spouts which are arranged in the radial direction of the cleaning tank. Furthermore, the solution supply nozzle provided at a center of a bottom portion of the cleaning tank, has a plurality of solution supply spouts opened in a radial direction.

BEST MODE FOR CARRYING OUT THE INVENTION

Figure 1:
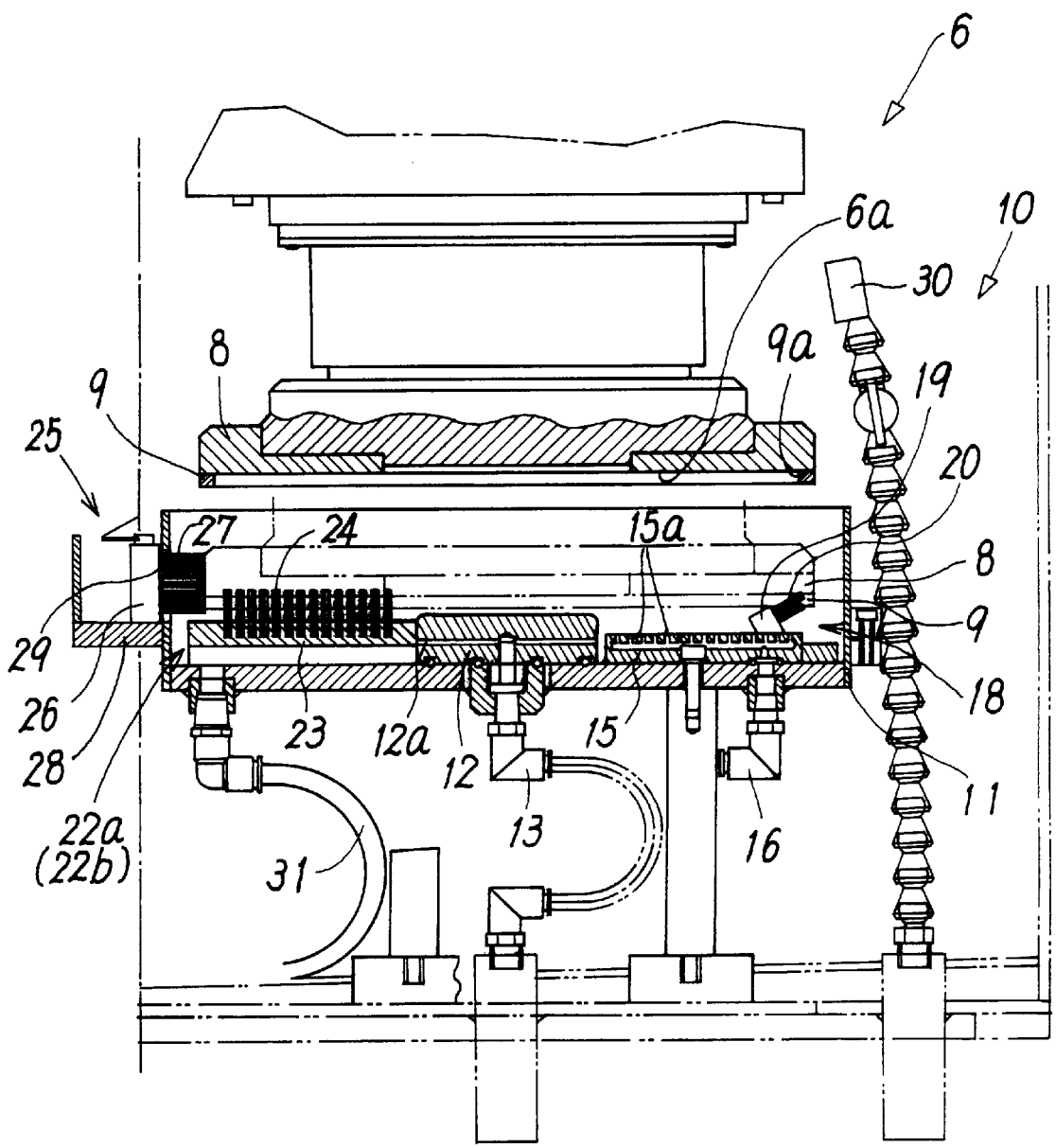
FIG. 1 is a longitudinal sectional view showing an embodiment of a cleaning apparatus in accordance with the present invention.
Figure 2:
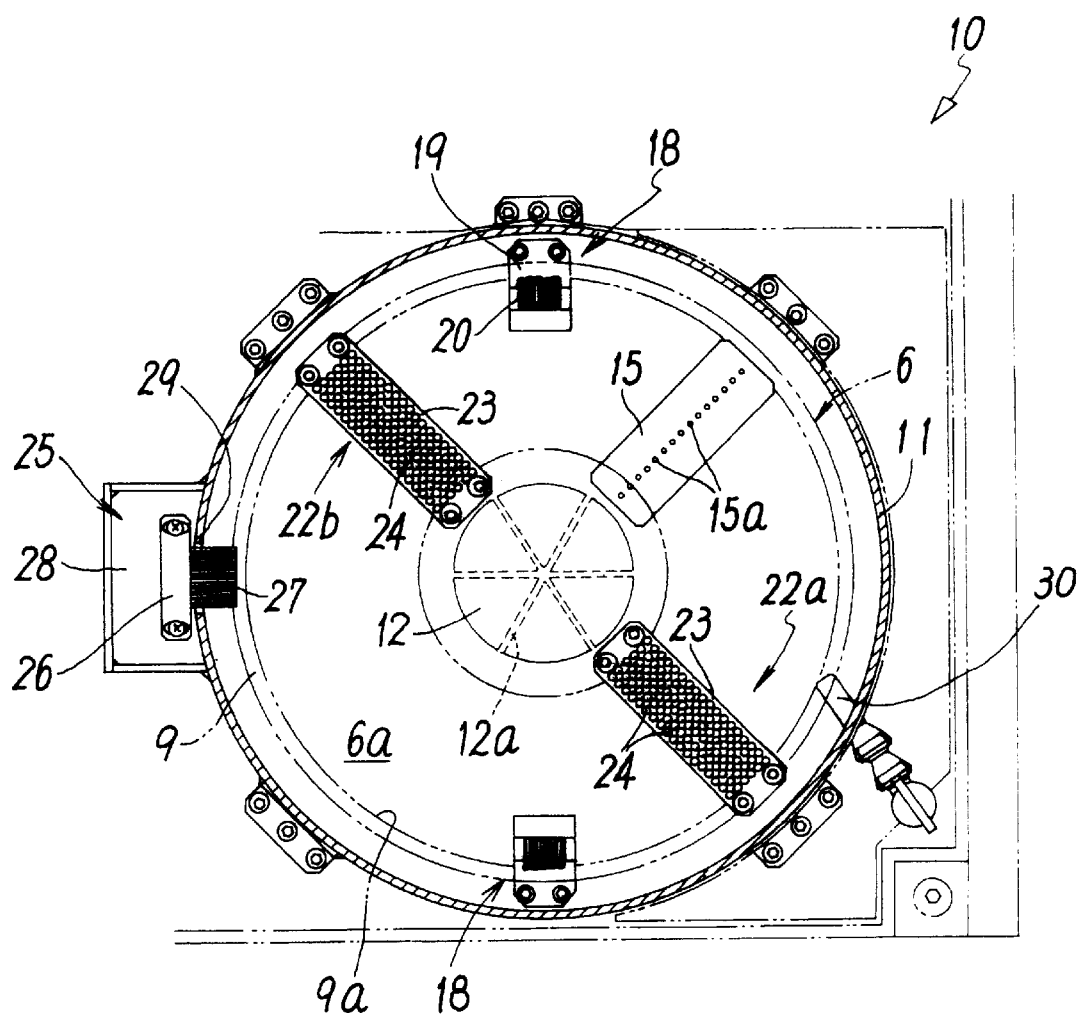
FIG. 2 is a transverse top plan view showing the cleaning apparatus of FIG. 1 with a dresser omitted.
Figure 3:
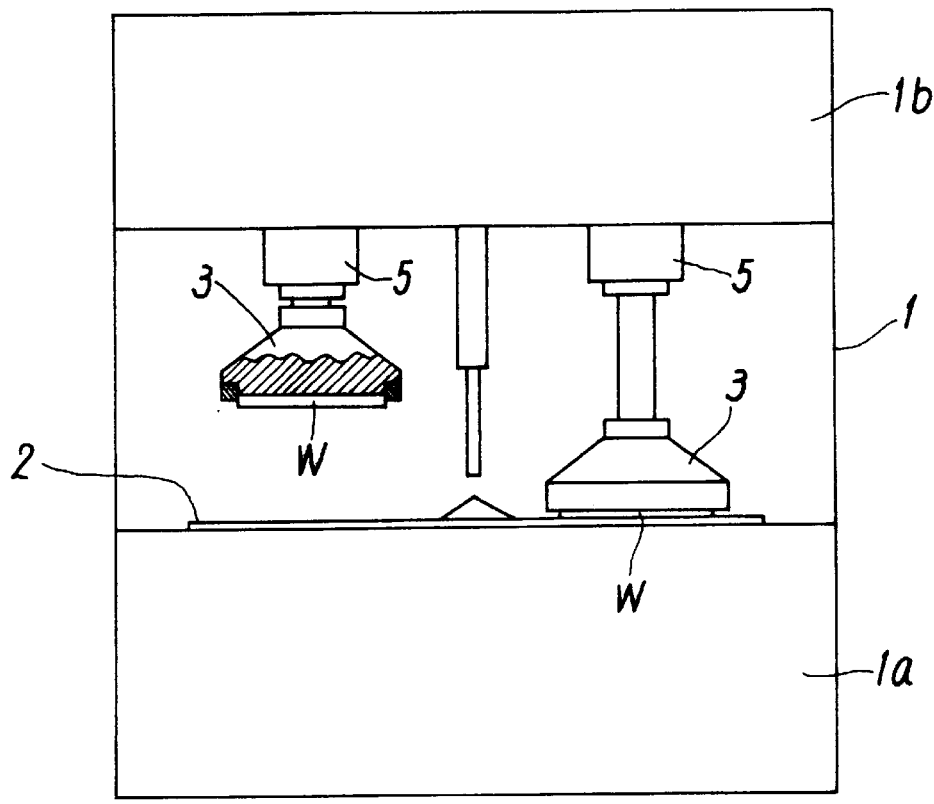
FIG. 3 is a front view showing an example of a plane polishing apparatus.
Figure 4:
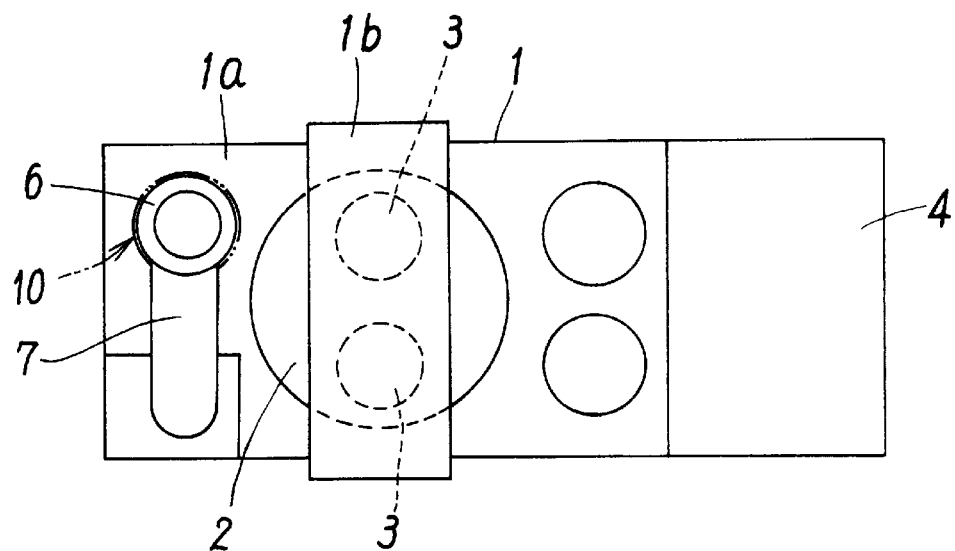
FIG. 4 is a schematic top plan view of the plane polishing apparatus of FIG. 3.
Figure 5:
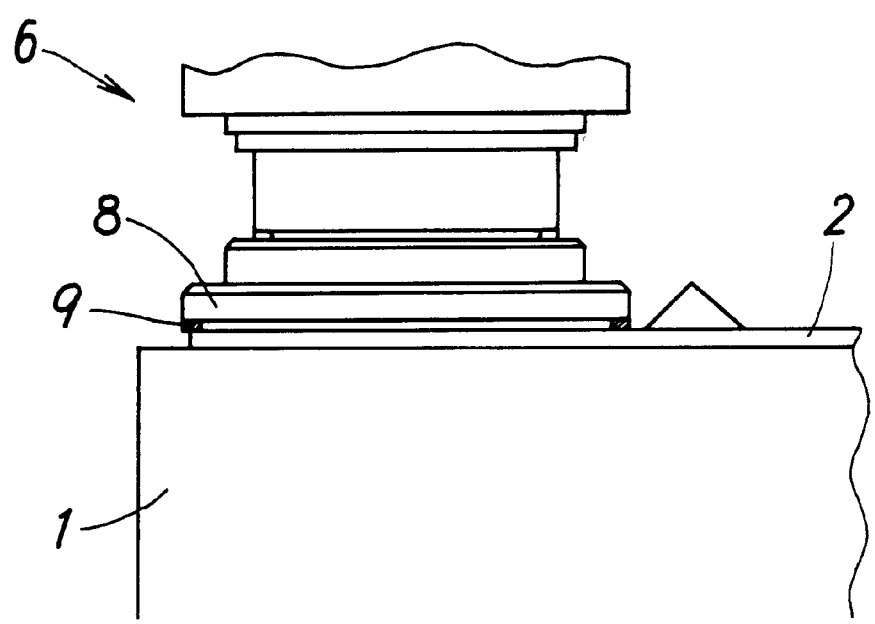
FIG. 5 is a sectional view showing an essential section of the dresser.

FIG. 1 and FIG. 2 show a typical embodiment of a cleaning apparatus for a dresser in accordance with the present invention. A cleaning apparatus 10 is installed near a dresser 6 in a plane polishing apparatus as shown, for example, in FIG. 4, the cleaning apparatus 10 being used for cleaning the dresser 6 placed in a standby mode.

The cleaning apparatus 10 has a bottomed cylindrical cleaning tank 11 to be filled with a cleaning solution. The cleaning tank 11 is sufficiently large to be able to accommodate the dresser 6 immersed in a cleaning solution. At a bottom center of the cleaning tank 11, a solution supply nozzle 12 for supplying a cleaning solution such as pure water is provided, the solution supply nozzle 12 being equipped with a plurality of solution supply spouts 12*a* opened in a radial direction. Reference numeral 13 in the drawing denotes a port for connecting the solution supply nozzle 12 to a cleaning solution source.

An air nozzle 15 for injecting air into a cleaning solution is provided on the bottom portion of the cleaning tank 11. The air nozzle 15 has a rectangular shape extending in the radial direction of the cleaning tank 11. Atop surface of the air nozzle 15 is provided with a plurality of air spouts 15*a* arranged in one row or a plurality of rows in the radial direction of the cleaning tank 11. Air injected out of the spouts 15*a* ascends in a cleaning solution to hit a portion of the bottom surface of the dresser 6 to be cleaned over the full width in the radial direction. Reference numeral 16 in the drawing denotes a port for connecting the air nozzle 15 to a compressed air source.

The bottom portion of the cleaning tank 11 is also provided with a plurality of first bottom surface brushes 18 for cleaning an annular dressing member 9 attached to the bottom surface of the dresser 6. The first bottom surface brushes 18 are composed of bristles 20 implanted in a brush base 19, and they are installed such that the bristles 20 are tilted at a required angle toward an inner peripheral surface 9*a* so as to positively clean the inner peripheral surface 9*a* of the dressing member 9 where foreign matters are likely to adhere and remain.

The bottom portion of the cleaning tank 11 is further provided with a plurality of second bottom surface brushes 22*a* and 22*b* which are arranged upward to clean a portion 6*a* of the bottom surface of the dresser 6, which is surrounded by the annular dressing member 9. The second bottom surface brushes 22*a* and 22*b* are composed of bristles 24 implanted in rectangular brush bases 23 extending in the radial direction of the cleaning tank 11, and are disposed such that the bristles 24 come in slidable contact with the full width of the annular portion 6*a* in the radial direction.

The two second bottom surface brushes 22*a* and 22*b* are provided with the bristles 24 that are different in length from each other, or provided with the bristles 24 of the same length but different heights so that the heights of the bristles are different from each other.

Thus, by setting the two second bottom surface brushes 22*a* and 22*b* to different heights, the second bottom surface brush 22*a* with tall bristles can be used first to clean the dresser 6, and when the tall bristles 24 have worn or deformed with resultant deteriorated slide frictional effect, the second bottom surface brush 22*b* with short bristles can be used. This arrangement permits prolonged use of the function of the brushes that are prone to wear or deform.

To replace the second bottom surface brush 22*a* with tall bristles, which have worn, by the second bottom surface brush 22*b* with short bristles, the cleaning position of the dresser 6 is slightly lowered, or conversely, the installing height of the second bottom surface brush 22*b* with short bristles is slightly increased. In this case, the bottom surface brush 22*a* with tall bristles which have worn may be either left installed or removed.

The cleaning tank 11 is further provided with a side surface brush 25 laterally disposed at a position where it comes in contact with the outer side surface of the dresser 6. The side surface brush 25 is composed of bristles 27 implanted in a rectangular brush base 26, the brush base 26 being fixed to a mount portion 28 formed on a part of the outer surface of the cleaning tank 11. The bristles 27 project into the cleaning tank 11 through an opening 29, which is formed in the cleaning tank 11, so as to come in slidable contact with the outer side surface of the dresser 6, i.e. the outer surfaces of a dressing head 8 and a dressing member 9.

In the illustrated example, only one side surface brush 25 is provided; however, a plurality of side surface brushes 25 may be provided instead.

Reference numeral 30 in the drawing denotes a cleaning nozzle which is provided outside the cleaning tank 11 and injects a cleaning solution to clean the outer side surface of the dresser 6.

Reference numeral 31 denotes a pipe for draining a solution. By opening a ball valve attached to the distal end of the pipe 31, a cleaning solution in the cleaning tank 11 can be drained.

In the cleaning apparatus 10 having the configuration set forth above, as shown in FIG. 1, the dresser 6 is placed in the cleaning tank 11 filled and overflowed with a cleaning solution supplied through the solution supply nozzle 12. When the dresser 6 immersed in the cleaning solution slowly turns, the inner peripheral surface 9*a* of the annular dressing member 9 comes in slidable contact with the first bottom surface brush 18 to remove attachments, and the portion 6*a* of the bottom surface of the dresser 6 which is surrounded by the dressing member 9 comes in slidable contact with the second bottom surface brush 22*a* with tall bristles so as to be cleaned. Furthermore, the outer peripheral surface of the dresser 6 comes in slidable contact with the side surface brush 25 so as to be cleaned. At the same time, air is injected from the air nozzle 15 to perform bubbling.

The bubbling enhances the effect for removing attachments by making use of impacts produced when bubbles burst; it not only further enhances the cleaning effect by being used in combination with the cleaning by the brushes 18, 22*a*, 22*b*, and 25, but also peels and washes off contaminants from the brushes 18, 22*a*, 22*b*, and 25.

When the bristles 24 of the second bottom surface brush 22*a* with tall bristles wear or deform with consequent deteriorated slide frictional effect, the second bottom surface brush 22*b* with short bristles is used to replace the brush 22*a*.

In the above embodiment, the second bottom surface brushes 22*a* and 22*b* are divided into a plurality of groups of different bristle heights; however, the second bottom surface brushes 22*a* and 22*b* may have the same bristle height. Furthermore, it is not required to always provide a plurality of second bottom surface brushes; the object of the present invention can be accomplished also by providing only one second bottom surface brush.

Thus, according to the present invention, the slide frictional cleaning by brushes used in combination with the bubbling cleaning with air makes it possible to easily and positively wash off attachments from the bottom surface and the outer peripheral surface of the dresser where the dressing member is installed.

REFERENCE NUMERALS

| Reference Numerals | |
| --- | --- |
| W ... Workpiece | 1 ... Machine body |
| 1a ... Base portion | 1b ... Movable portion |
| 2 ... Lap | 3 ... Carrier |
| 4 ... Carrying in/out portion | 5 ... Cylinder |
| 6 ... Dresser | 6a ... Portion |
| 7 ... Support arm | 8 ... Dressing head |
| 9 ... Dressing member | 9a ... Inner peripheral surface |
| 10 ... Cleaning apparatus | 11 ... Cleaning tank |

-continued

Reference Numerals

| | |
|---|---|
| 12 ... Solution supply nozzle | 12a ... Solution supply spout |
| 13 ... Port | 15 ... Air nozzle |
| 15a ... Spout | 16 ... Port |
| 18 ... Fist bottom surface brush | 19 ... Brush base |
| 20 ... Bristle | |
| 22a, 22b ... Second bottom surface brush | |
| 23 ... Brush base | 24 ... Bristle |
| 25 ... Side surface brush | 26 ... Brush base |
| 27 ... Bristle | 28 ... Mount portion |
| 29 ... Opening | 30 ... Cleaning nozzle |
| 31 ... Pipe | |

What is claimed is:

1. A cleaning apparatus of a dresser for dressing a lap, comprising:
    a cleaning tank for accommodating a dresser, to which a dressing member for dressing a working surface of a lap has been attached to a bottom surface of a round dressing head, in a state where said dresser is immersed in a cleaning solution;
    a solution supply nozzle for filling said cleaning tank with a cleaning solution;
    an air nozzle provided in said cleaning tank to inject air into the cleaning solution;
    at least one first bottom surface brush disposed in the cleaning tank such that said first bottom surface brush comes in slidable contact with dressing member of bottom surface of said dresser; and
    at least one side surface brush provided laterally in said cleaning tank such that said side surface brush comes in slidable contact with an outer peripheral surface of the dresser.

2. A cleaning apparatus according to claim 1, wherein at least one second bottom surface brush that comes in slidable contact with a portion other than said dressing member on the bottom surface of the dresser is provided in said cleaning tank.

3. A cleaning apparatus according to claim 2, wherein the dressing member on the bottom surface of said dresser has an annular shape; said first bottom surface brush is provided such that bristles are tilted at an angle so as to be in slidable contact with an inner peripheral surface of said dressing member in order to clean said dressing member; said second bottom surface brush is installed such that said first bottom surface brush extends in a radial direction of the cleaning tank in order to clean a portion of the bottom surface of the dresser that is surrounded by said dressing member; and said side surface brush is disposed in a position where said side surface brush is brought into slidable contact with an outer peripheral surface of the dressing member.

4. A cleaning apparatus according to claim 3, wherein a plurality of said second bottom surface brushes are provided, bristle heights thereof being different from each other.

5. A plane polishing apparatus comprising a cleaning apparatus described in claim 3.

6. A cleaning apparatus according to claim 2, wherein a plurality of said second bottom surface brushes are provided, bristle heights thereof being different from each other.

7. A plane polishing apparatus comprising a cleaning apparatus described in claim 2.

8. A cleaning apparatus according to claim 1, wherein said air nozzle has a plurality of air spouts, said spouts being arranged in a radial direction in a bottom portion of the cleaning tank.

9. A cleaning apparatus according to claim 1, wherein said solution supply nozzle is provided at a center of a bottom portion of the cleaning tank, and has a plurality of solution supply spouts opened in a radial direction.

10. A plane polishing apparatus comprising a cleaning apparatus described in claim 1.

* * * * *